(12) United States Patent
Natsume et al.

(10) Patent No.: US 6,890,447 B2
(45) Date of Patent: May 10, 2005

(54) METHOD OF FORMING NOBLE METAL THIN FILM PATTERN

(75) Inventors: Kiyoshi Natsume, Mikkabi-cho (JP); Hiroshi Naito, Hamamatsu (JP)

(73) Assignee: Yamaha Corporation, Shizuoka-ken (JP)

( * ) Notice: Subject to any disclaimer, the term of this patent is extended or adjusted under 35 U.S.C. 154(b) by 182 days.

(21) Appl. No.: 10/208,811

(22) Filed: Aug. 1, 2002

(65) Prior Publication Data

US 2003/0024898 A1 Feb. 6, 2003

(30) Foreign Application Priority Data

Aug. 3, 2001 (JP) ........................................ 2001-236062
Dec. 28, 2001 (JP) ........................................ 2001-398728

(51) Int. Cl.[7] .......................................... H01L 21/3205
(52) U.S. Cl. ................. 216/12; 13/40; 13/47; 13/51; 427/125
(58) Field of Search .............................. 216/13, 40, 47, 216/51, 50, 12; 427/125, 259, 404

(56) References Cited

U.S. PATENT DOCUMENTS 5,017,459 A * 5/1991 McColgin .................. 430/299
5,091,342 A * 2/1992 Studebaker et al. ........ 438/577
5,610,090 A * 3/1997 Jo .............................. 438/577

FOREIGN PATENT DOCUMENTS

| JP | 64-65876 | 3/1989 |
| JP | 6-21052 | 1/1994 |
| JP | 6-267843 | 9/1994 |
| JP | 7-70817 | 7/1995 |

OTHER PUBLICATIONS

Copy of Korean Office Action dated Jul. 22, 2004 (and English translation of relevant portion).

* cited by examiner

Primary Examiner—Allan Olsen
(74) Attorney, Agent, or Firm—Dickstein, Shapiro, Morin & Oshinsky, LLP.

(57) ABSTRACT

A sacrificial film is formed on a substrate and a mask layer is formed on the sacrificial film. An opening having a predetermined pattern is formed through the mask layer. The sacrificial film exposed in the opening is removed to form a cave broader than the opening on the substrate. A noble metal thin film is deposited on the whole substrate surface. The sacrificial film 12 is dissolved and removed to form a noble metal thin film pattern.

20 Claims, 7 Drawing Sheets ize a resist pattern and form tapered side walls.

METHOD OF FORMING NOBLE METAL THIN FILM PATTERN

CROSS REFERENCE TO RELATED APPLICATION

This application is based on Japanese Patent Applications No. 2001-236062, filed on Aug. 3, 2001 and No. 2001-398728, filed on Dec. 28, 2001, the entire contents of which are incorporated herein by reference.

BACKGROUND OF THE INVENTION

A) Field of the Invention

The present invention relates to a method of forming a thin film pattern of noble metal such as platinum.

B) Description of the Related Art

A temperature sensor using a platinum thin film resistor is formed by depositing a platinum thin film on a substrate and pattering it in a fine wire shape to form a resistor. A change in the electrical resistance value of the platinum resistor is detected to measure the temperature.

The temperature characteristics of a platinum thin film are important characteristics. The temperature characteristics of a platinum thin film depend on the film qualities such as the diameter of crystal grains of the platinum thin film. The diameter of crystal grains is influenced by the thin film forming conditions.

A sensor of a thin membrane structure having a platinum resistor covered with an oxide film or the like has drawn attention because it has a small thermal capacity and a good response. An insulating film is formed on a silicon substrate, and a platinum resistor is formed on the insulating film. After the platinum resistor is covered with an insulating film, the silicon substrate under the platinum resistor is etched and removed. By removing the thermal conduction and thermal capacity of the silicon substrate, a temperature sensor of a high sensitivity and a high response can be obtained.

A temperature sensor of such a membrane structure is required to have a high mechanical strength of the membrane structure itself. Levels satisfying this requirements are necessary for working and finishing a platinum thin film pattern.

For example, it is necessary to prevent dusts and foreign matters from being attached to a platinum thin film pattern and prevent the underlying oxide film from being made too thin or damaged during patterning the platinum thin film. If the side wall of the platinum thin film pattern is vertical to the surface layer of the substrate, the quality of an insulating film such as an oxide film to be deposited on the platinum thin film pattern is likely to be degraded. The mechanical strength of the membrane structure is therefore lowered. It is desired to make the platinum thin film pattern have a trapezoidal cross section with tilted or sloped side walls.

The following two methods have been adopted to form a platinum thin film pattern.

With the first method, as shown in FIG. 3A, an insulating film 7 is formed on the whole upper surface of a substrate 1, and a platinum thin film 2 is deposited on the insulating film 7 by sputtering or the like. Resist is coated on the platinum thin film 2, exposed and developed to leave a resist pattern 3 in a necessary area. The resist pattern 3 is heated to 150 to 200° C. to fluidize it and form tapered side walls.

As shown in FIG. 3B, the platinum thin film 2 is milled in a milling system. A tapered side wall of the resist pattern 3 is exaggeratedly transferred to the platinum thin film. After the platinum thin film 2 is patterned, the resist pattern 3 is removed by ashing or the like. As shown in FIG. 3C, an insulating film 8 is formed on the substrate, covering the patterned platinum thin film 2.

As shown in FIG. 3D, the substrate 1 under the platinum thin film 2 is etched and removed. With this first method, since milling is a physical work utilizing impacts of ions having a high energy, hardened resist after milling and sputtered side wall residues 4 peculiar to milling (so-called rabbit ear) are left and are hard to be removed.

It is necessary to fix the substrate 1 with a clamp in order to perform milling. Clamping may damage the product and the manufacture yield may be lowered. The surface layer of the substrate is also milled. Depending upon the milling conditions, the insulating film 7 is excessively milled to form a groove-like recess 5 as shown in FIG. 3C. The product quality may be lowered, e.g., a lowered mechanical strength.

The degree of the taper or slope of a side wall of the platinum thin film pattern depends upon the taper or slope degree of the resist pattern side walls. As the width of the resist pattern becomes narrow, the slope degree of the resist pattern cannot be made large. If the temperature of post-baking the resist pattern is raised to increase the slope degree of the resist pattern side walls, it becomes difficult to remove the resist pattern.

With the second method, as shown in FIG. 4A, on an insulating film 7 formed on a substrate 1, a resist film 3 is coated. The resist film 3 in an area where a platinum thin film pattern is to be formed is removed. In this case, the resist film 3 is made sufficiently thick so that a platinum thin film to be deposited at the next process has stepwise cuts. In addition, a focus of resist exposure is shifted intentionally to broaden the opening of the resist film downward along a thickness direction. Thus, the opening formed in the resist film has an upwardly decreasing width, or inwardly declined side walls.

As shown in FIG. 4B, a platinum thin film 2 is deposited on the whole surface. A platinum thin film 2 on the resist film 3 and a platinum thin film 2 on the insulating film 7 have stepwise cuts. The platinum thin film 2 on the insulating film 7 has an upwardly gradually thinned periphery. The resist film 3 is removed to lift off the unnecessary platinum thin film 2 on the resist film 3.

As shown in FIG. 4C, the platinum thin film pattern 2 is left.

With this second method, it is difficult to set the taper or slope degree of the side wall of the platinum thin film pattern with good controllability. Although the controllability can be improved by adopting a two-layer structure of the resist film 3, the number of processes is increased. If organic material such as resist is used, moisture compositions, unreacted compositions, dissolved compositions are produced from the resist film 3 when the platinum thin film 2 is deposited. These compositions adversely affect the quality of the platinum thin film. Since platinum has crystallinity, if impurities are mixed, the crystal growth becomes insufficient and the temperature characteristics are degraded. It is difficult to form the platinum thin film 2 having a good quality. If the resist film 3 is processed at a high temperature to remove these compositions beforehand, it becomes difficult to remove the resist film 3.

SUMMARY OF THE INVENTION

An object of this invention is to provide a method of forming a noble metal thin film pattern having a good quality and being easy to cover the surface thereof with an insulating film.

Another object of the invention is to provide a method of forming a noble metal thin film pattern, capable of controlling the taper or slope degree of side walls of the noble metal thin film pattern with good reproductivity, being less influenced by gas generated from resist, not etching a surface layer of a substrate excessively, and less lowering a mechanical strength.

According to one aspect of the present invention, there is provided a method of forming a noble metal thin film comprising steps of: (a) forming a sacrificial film on a substrate and stacking a mask layer of different etching characteristics on the sacrificial film; (b) forming an opening having a predetermined pattern through said mask layer; (c) etching said sacrificial film exposed in said opening and side-etching said sacrificial film over a boundary of the opening of said mask layer by a predetermined amount; (d) depositing a noble metal thin film on a whole surface of said substrate; and (e) dissolving and removing said sacrificial film.

A noble metal thin film pattern is made of a noble metal thin film having a predetermined shape (pattern) and is used for forming a target circuit, resistor or the like.

According to the noble metal thin film pattern forming method described above, the taper or slope angle of the side walls of the noble metal thin film pattern can be controlled with good reproductivity. While a noble metal thin film is deposited, organic material such as resist does not exist so that the deposited noble metal thin film will not be contaminated by gas or the like generated by organic material.

All processes can be performed by standard facilities of semiconductor manufacture lines. It is unnecessary to prepare particular facilities.

DESCRIPTION OF THE PREFERRED EMBODIMENTS

Figure 1A:
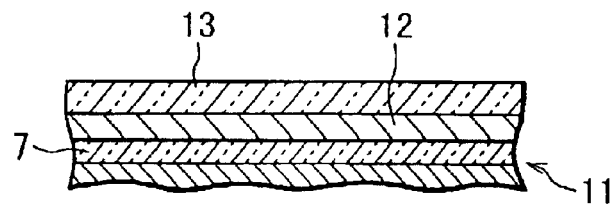
FIGS. 1A to 1H are schematic cross sectional views illustrating an example of a series of processes of a method of forming a noble metal thin film pattern.

Description will be made on the preferred embodiments of the invention, referring to the drawings. FIGS. 1A to 1G illustrate an example of processes of a noble metal thin film pattern forming method according to an embodiment of the invention.

As shown in FIG. 1A, on the surface of a substrate 11 made of glass, quartz, ceramics, silicon or the like, an insulating film such as an oxide film or a nitride film is formed. In the following, the description will be given on an example using a silicon substrate formed with an insulating film 7 such as a silicon oxide film.

A sacrificial film 12 is deposited on the substrate 11 by sputtering or chemical vapor deposition (CVD). The material of the sacrificial film 12 is material which can control a side etching amount of wet etching by acid or alkali liquid or a side etching amount of plasma etching, can be efficiently dissolved and removed by acid or alkali liquid, and does not contaminate the final product itself and a manufacture line. For example, the sacrificial film 12 is made of metal other than noble metal such as titanium, aluminum, chromium and copper.

Next, on the whole surface of this sacrificial film 12, a mask layer 13 is deposited. The mask layer 13 is made of material which has a resistance against etching the sacrificial film 12 and can function as a hard mask. For example, the mask layer 13 has a thickness of 300 to 500 nm and is an oxide film such as a silicon oxide film or a nitride film such as a silicon nitride film respectively formed by CVD or the like, a phosphosilicate glass (PSG) film or a borophosphosilicate glass (BPSG) film formed by atmospheric pressure CVD, a spin-on-glass (SOG) film formed by coating, an insulating film or a metal film formed by sputtering.

Figure 1B:
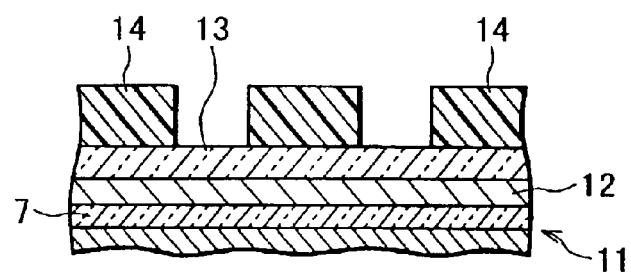

As shown in FIG. 1B, a resist pattern 14 is formed on the mask layer 13, the resist pattern having an opening where a noble metal thin film pattern is to be formed. The resist pattern 14 is formed by ordinary photolithography.

Figure 1C:
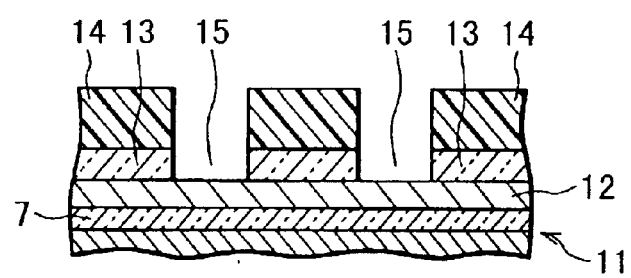

As shown in FIG. 1C, by using the resist pattern 14 as a mask, the mask layer 13 is dry-etched to form an opening 15. Dry etching may be reactive ion etching using gas such as $CHF_3$ and $CF_4$.

Figure 1D:
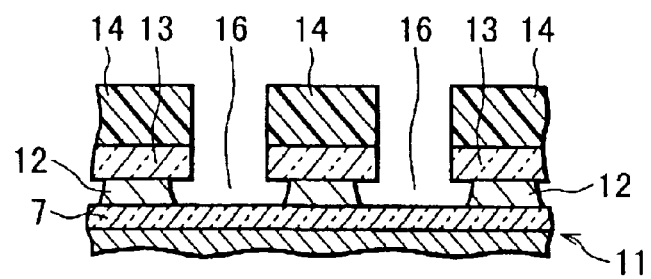

As shown in FIG. 1D, the sacrificial film 12 exposed in the opening 15 is etched and side-etched to form a cave 16 broader than the opening 15 above the substrate 11.

This etching may be performed using chemicals such as dilute hydrofluoric acid, and sulfuric acid+hydrogen peroxide, or by plasma etching using gas such as $CF_4$.

The side etching amount of the sacrificial film 12 is set to 1 to 5 $\mu$m. Side etching progresses at a speed of 1 $\mu$m/min at the room temperature if the sacrificial film 12 is made of titanium and 5% HF is used as etchant. If HF diluted more is used, the side etching amount can be controlled more easily.

Etchant of sulfuric acid+hydrogen peroxide intrudes the mask layer 13 and substrate 11 not at all and side-etches only the titanium sacrificial film 12. Although this etchant is ideal, the side etching may progress too much and the mechanical strength may be lowered unless the concentration and temperature of the etchant are strictly controlled.

Figure 1E:
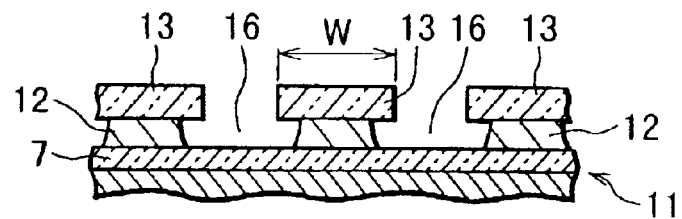

As shown in FIG. 1E, the resist pattern 14 is removed by oxygen plasm ashing or the like. The resist pattern 14 may be removed before the preceding process of etching the sacrificial film 12. However, in this case, it may become difficult to control the side etching of the sacrificial film 12 because of oxidation of the sacrificial film 12. Next, pre-washing is performed before deposition of a noble metal thin film. This pre-washing is performed without damaging the film structure formed on the substrate 11.

For example, after a process using organic material remover, the substrate 11 is washed with isopropanol and then with pure water and thereafter dried. If the resist pattern 14 is removed before etching the sacrificial film 12, etching the sacrificial film 12 with dilute hydrofluoric acid functions also as this pre-washing.

Figure 1F:
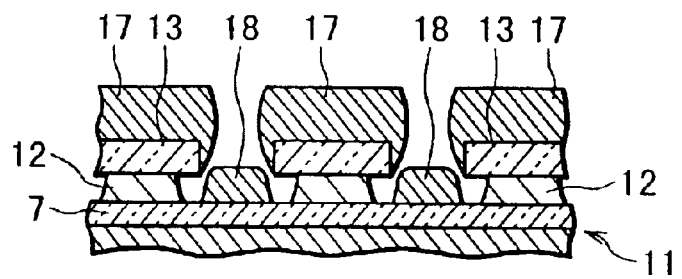

As shown in FIG. 1F, a noble metal thin film 17 is deposited on the substrate to form a noble metal thin film 17 on the mask layer 13 and a noble metal thin film pattern 18 in the cave 16. Depositing the noble metal thin film is performed by directional deposition such as sputtering and vapor deposition.

It is preferable that before this deposition the substrate 11 is heated to remove absorbed moisture contents. At the same time when deposition is performed, the substrate 11 may be heated to adjust the film quality of the noble metal thin film pattern 18.

The material of the noble metal thin film may be not only a single film of noble metal such as platinum and gold but also a lamination film having a noble metal uppermost layer such as Au/Ni/Ti, Pt/Ti and Pt/TiO.

A target noble metal thin film pattern 18 is therefore formed in the cave 16 above the substrate 11.

The substrate 11 is fully immersed in etchant for the sacrificial film 12 to dissolve the sacrificial film 12 above the substrate 11 and lift off the mask layer 13 and the noble metal thin film 17 deposited on the mask layer 13.

Figure 1G:
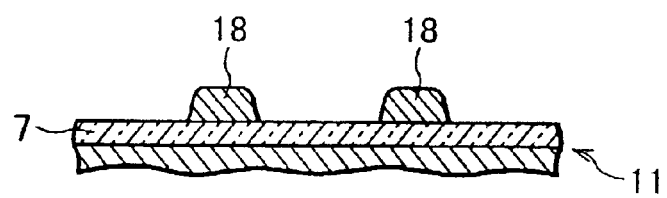

FIG. 1G shows the noble metal thin film pattern 18 having a desired shape and formed in a desired area above the substrate 11.

The etchant is chemicals which do not corrode noble metal but dissolve general metal. For example, the chemicals are acid such as nitric acid, hydrochloric acid, hydrofluoric acid and sulfuric acid, alkali such as ammonium and potassium hydroxide, or sulfuric acid+hydrogen peroxide. If hydrofluoric acid or alkali is used and if the surface layer of the substrate 11 is an oxide film, this oxide film is corroded more or less. If a nitride film is used as the surface layer of the substrate, it is not corroded by hydrofluoric acid or alkali.

If the sacrificial film 12 is made of titanium and if solution of sulfuric acid+hydrogen peroxide (3:1) is used at 130° C., only titanium is dissolved and a silicon oxide film often used as the surface layer of the substrate 11 is corroded not at all. Under these conditions, side etching of about 5 $\mu$m in 5 minutes progresses at a temperature of 150° C.

The shape of the noble metal thin film pattern 18 is determined by the opening pattern of the mask layer 13 placed on the sacrificial film 12. The unnecessary noble metal thin film is lifted off while the sacrificial film 12 is etched. This removing process prevents the surface layer of the substrate from being damaged.

Figure 1H:
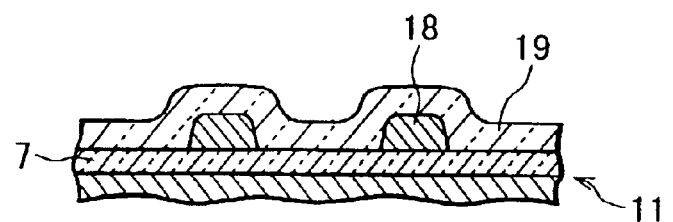

As shown in FIG. 1H, an insulating film 19 such as a silicon oxide film is deposited covering the noble metal thin film pattern 18. The insulating film may also be formed of a silicon nitride film or a lamination of a silicon oxide film and a silicon nitride film. When lamination structure is employed, it is preferable that the lower and upper insulating films 7 and 19 have a symmetrical structure, such as oxide-nitride and nitride-oxide.

Figure 1I:
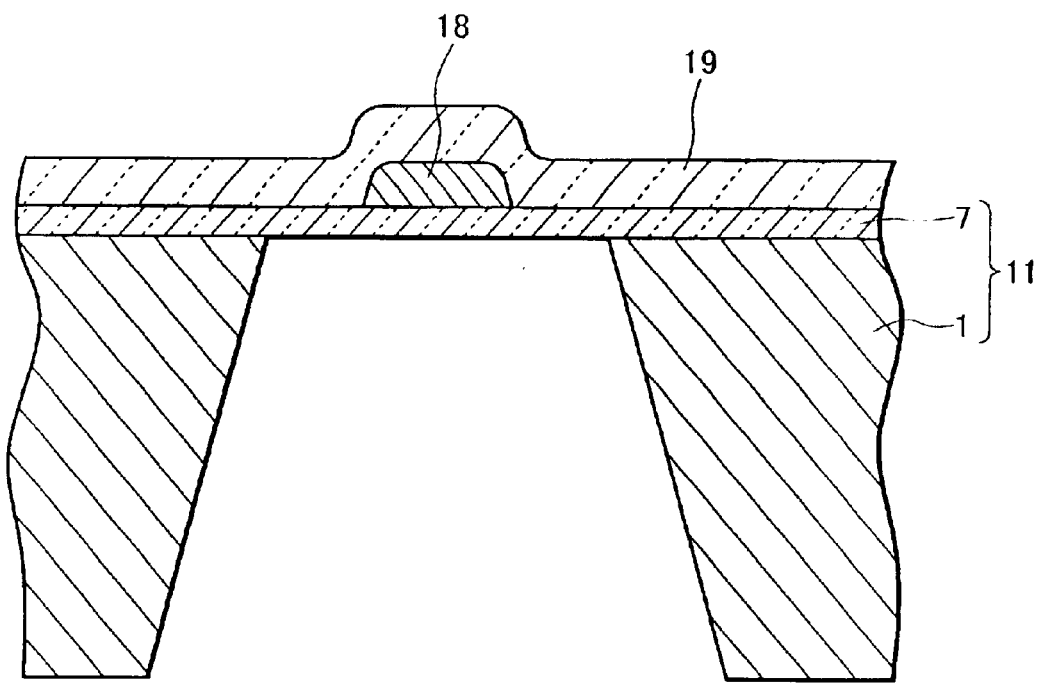
FIGS. 1I and 1J are a schematic cross sectional view and a schematic plan view of a temperature sensor.

FIG. 1I shows a substrate 11 comprising a silicon substrate 1 and a silicon oxide film 7 formed on the silicon substrate 1, a portion of the silicon substrate 1 under the noble metal thin film pattern 18 being removed. The removal of the silicon substrate can be performed by etching, or combination of polishing or milling and etching. The noble metal thin film pattern 18 is held sandwiched between the upper and lower insulating films 19 and 7.

Figure 1J:
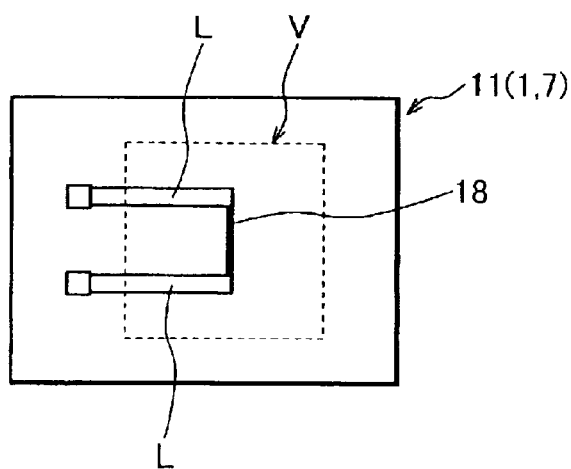

FIG. 1J is a plan view showing the layout of a temperature sensor. The substrate 11 comprises the silicon substrate 1 and the silicon oxide film 7 formed on the silicon substrate 1. In a window area V indicated by a broken line, the silicon substrate 1 is removed. A platinum resistor 18 is formed on the silicon oxide film 7 in the central area of the window area V, and has a width of about several $\mu$m. Leads L are made of a platinum thin film having a width of about 50 to 100 $\mu$m and made of the same layer as the platinum resistor 18.

The leads L are electrically connected to opposite ends of the platinum resistor 18.

The silicon oxide film 19 is formed covering the platinum resistor 18 and leads L. Pads P are formed on the silicon oxide film 19 and electrically connected to the leads L via openings.

It is preferable that the thickness of the sacrificial film 12 is set to 0.7 to 1.7 times the thickness of the noble metal thin film pattern to be formed. For example, if the thickness of the noble metal thin film pattern is 300 nm, the thickness of the sacrificial film 12 is set to 200 to 500 nm. If the sacrificial film 12 is too thick, a precision of patterning the noble metal thin film lowers. If the sacrificial film is too thin, it becomes difficult to properly slope the side walls of the noble metal thin film pattern to be formed, and chemicals for removing the sacrificial film 12 intrude insufficiently. In addition, the noble metal thin film on the mask layer and the noble metal thin film deposited in the cave may be connected so that the lift-off process becomes difficult.

If the taper or slope angle of the side walls of the noble metal thin film pattern is to be made gentle, it is preferable to set the thickness of the sacrificial film 12 to 1 to 1.7 times the thickness of the noble metal thin film. If the slope angle of the side walls of the noble metal thin film pattern is to be made sharp, it is preferable to set the thickness of the sacrificial film 12 to 0.7 to 1 time the thickness of the noble metal thin film.

The mask layer 13 is desired that even if the noble metal thin film is deposited, a portion of the noble metal thin film extending over the cave will not be deformed, that an opening can be formed easily, and that an etching rate of hydrofluoric acid or plasm is sufficiently low in order not to increase a size conversion difference (a difference between a designed size and an actually worked size) during side etching of the sacrificial film 12. A large size conversion difference means that when the metal sacrificial film 12 is etched as shown in FIG. 1D, the mask layer 13 is also etched and the opening width of the mask layer 13 is broadened so that the line width of the noble metal thin film pattern 18 (FIG. 1G) becomes wider than the design size.

If the mask layer 13 is made thick, the mechanical strength thereof increases. However, the shade area of noble metal particles to be deposited obliquely in the cave becomes large. The slope of the side walls and thickness become different between a noble metal thin film pattern having a wider line width and a noble metal thin film pattern having a narrower line width.

In order to form adjacent pattern segments of the noble metal thin film pattern, the width (indicated at W in FIG. 1E) of the mask layer 13 to be formed between the adjacent pattern segments is required to be selected properly. Namely, the plan size of the area of the resist in the resist pattern 14 shown in FIG. 1B should be properly set.

The width W is preferably set to about 3 to 40 $\mu$m. It is necessary that chemicals used for removing the whole sacrificial film 12 in the later process sufficiently reach the inside of the cave. The width W is preferably set to about 40 $\mu$m or less from this viewpoint. The width W is preferably about 3 $\mu$m or broader in order to maintain the mechanical strength while the sacrificial film 12 is side-etched in the succeeding process.

If the etching conditions of the dry etching shown in FIG. 1C are properly selected, the side walls of the mask layer 13 exposed in the opening 15 can be tapered or sloped so that the slope shape of the side walls of the noble metal thin film pattern, particularly the thickness of the pattern having the narrow line width, can be finely adjusted.

It is preferable to incline the incidence angle of noble metal particles upon the substrate 11 relative to the substrate normal, because the side walls of the noble metal thin film pattern can be inclined in an ordinary taper shape (the width of the pattern is made narrower at a higher position).

The incidence angle of noble metal particles upon the substrate 11 can be inclined easily, for example, by adjusting the relative positions of the substrate 11 and the target or vapor deposition source of the sputtering system or vapor deposition system.

Figure 5:
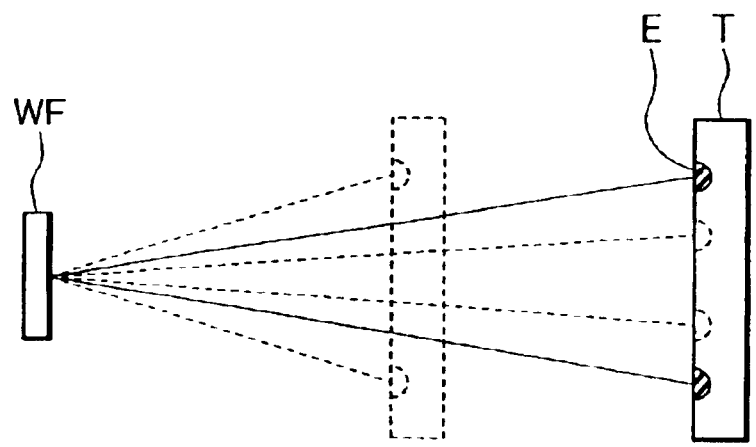
FIG. 5 is a schematic cross sectional view illustrating magnetron sputtering.

FIG. 5 shows the relation between a target and a substrate during magnetron sputtering. A wafer WF is disposed in parallel to the target T. Generally, the target T is larger than the wafer W and has an erosion E where a magnet is disposed. As the distance between the target T and wafer W is shortened, the number of particles incident more obliquely upon the wafer W increases. Namely, the incidence angle distribution changes as the distance between the wafer and target is changed.

In the case of a DC magnetron sputtering system, the erosion area of the target is broadened to the area similar to that of a substrate in order to allow uniform deposition of particles on the substrate. The incidence direction of noble metal particles upon a substrate is generally more slanted relative to the substrate normal, and the average incidence angles distance to the cave 16 becomes large. As shown in FIG. 2B, the slope of the side wall of the noble metal thin film pattern 18 becomes gentle.

Figure 2A:
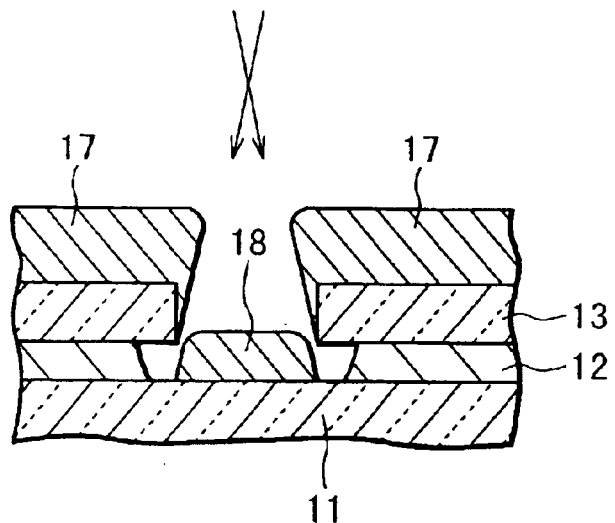
FIGS. 2A and 2B are schematic cross sectional views showing the relation between incidence angles of particles for forming noble metal thin film grains upon a substrate and taper or slope angles of the side walls of a finished noble metal thin film pattern.
Figure 2B:
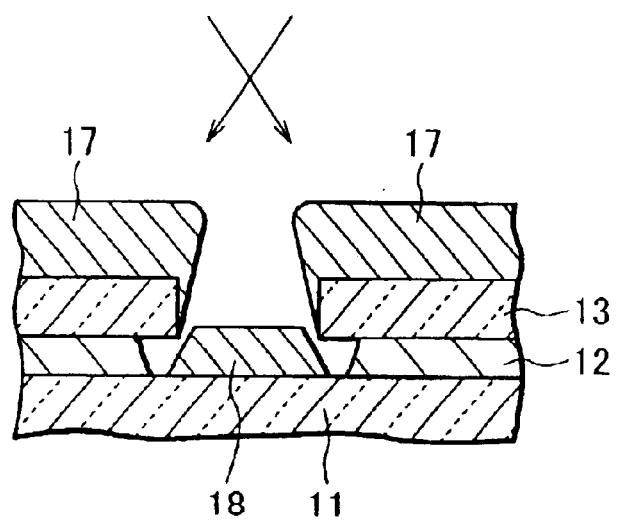
Figure 3A:
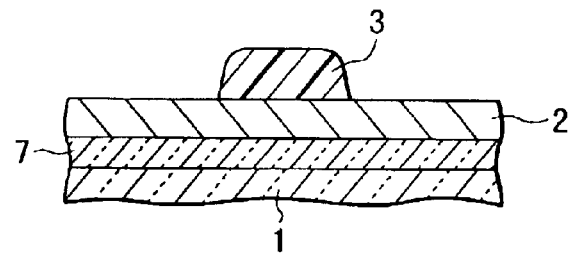
FIGS. 3A to 3D are schematic cross sectional views illustrating an example of a series of processes of a method of forming a noble metal thin film pattern according to related art.
Figure 3B:
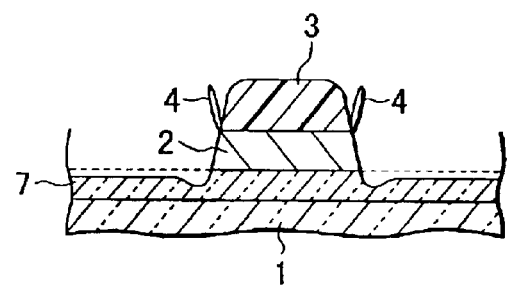
Figure 3C:
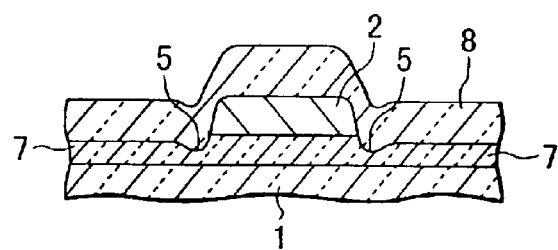
Figure 3D:
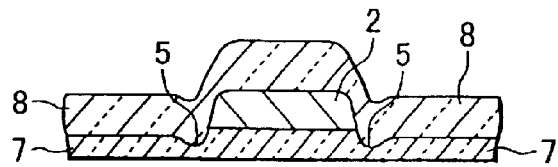
Figure 4A:
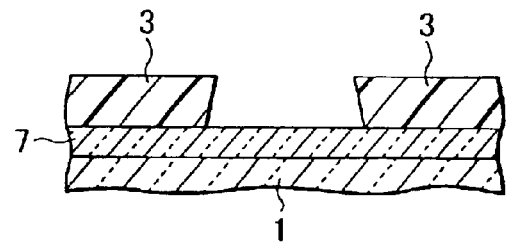
FIGS. 4A to 4C are schematic cross sectional views illustrating an example of a series of processes of a method of forming a noble metal thin film pattern according to related art.
Figure 4B:
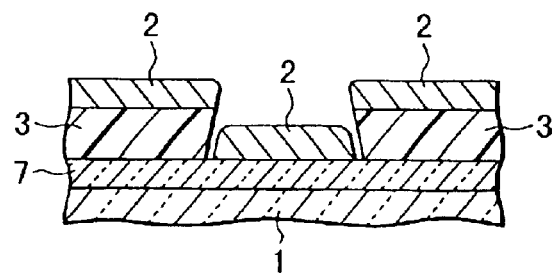
Figure 4C:
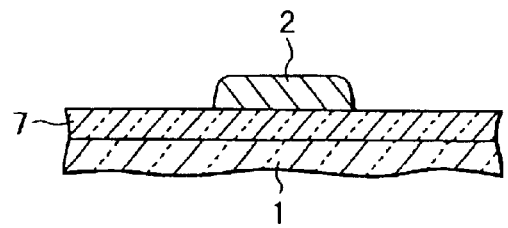

As shown in FIG. 2A, as the incidence angle is less slanted relative to the substrate normal, the slope of the side wall of the noble metal thin film pattern 18 becomes steep.

In the case of a vapor deposition system such as election beam (EB) deposition system, the incidence angle cannot be slanted more than that of the sputtering system. However, since the angle between flight direction from a deposition source and a substrate normal can be changed freely, the slope angle of the side wall of the noble metal thin film pattern 18 can be adjusted as desired, for example, by depositing a layer from a plurality of deposition sources.

With such a noble metal thin film pattern forming method, the slope angle of the side wall of the noble metal thin film pattern 18 can be controlled in a wide range with good reproductivity. Organic material do not exist on the substrate 11 while the noble metal thin film is deposited. It is possible to prevent the deposited noble metal thin film from being contaminated by gas or the like generated from the organic material. Since deposition is performed in a high vacuum state or in a low pressure atmosphere of inert gas, the noble metal thin film pattern 18 of a good film quality can be formed.

It is also possible to avoid foreign matters or damages of the noble metal thin film pattern 18. Damages of the substrate 11 during the processes can be prevented and a lowering of mechanical strength and a lowering of manufacture yield can be avoided. Since manufacture processes can be performed by using standard facilities of a semiconductor manufacture line, any specific additional facilities are not required.

A particular noble metal thin film pattern forming method will be described.

On a silicon oxide film formed on the surface of a silicon substrate, a titanium sacrificial film was deposited by sputtering to a thickness of 300 nm. On this sacrificial film, a mask layer of silicon nitride was deposited by plasma CVD to a thickness of 300 nm. On this mask layer, a positive type photoresist film was coated, exposed and developed to form a resist pattern having a fine wire shape opening with a width of 1500 nm. By using the resist pattern as a mask, the mask layer of silicon nitride was etched by plasma etching using gas of $CF_4+CHF_3$ to form an opening of a fine wire shape having an opening width of 1500 nm. The titanium sacrificial film exposed in the opening was etched and side-etched with aqueous solution of sulfuric acid and hydrogen peroxide to form a cave of a fine wire shape having a width of 3500 nm on the silicon oxide film formed on the substrate.

The resist pattern was plasma-ashed and removed. After the substrate was washed and dried, a platinum thin film was deposited over the whole substrate surface by using a DC magnetron sputtering system. The distance between the target and wafer and the like were set so that the incidence angle of platinum particles was 45 degrees relative to the substrate normal. The deposition thickness was about 300 nm.

The substrate was immersed in aqueous etching solution of sulfuric acid and hydrogen peroxide at 130° C. for 10 minutes to dissolve the titanium sacrificial film and lift off the mask layer and platinum thin film. A platinum thin film pattern was formed on the substrate, having an upper line width of 1200 nm, a lower line width of 1600 nm, a thickness of 300 nm and a side wall slope angle of about 45 degrees.

The platinum thin film pattern formed in the above manner had no foreign matter on the side walls and upper surface, and the surface oxide layer of the substrate was not corroded. The film quality was good. This platinum thin film pattern was used as a platinum resistor temperature sensor. Good temperature characteristics were obtained.

The present invention has been described in connection with the preferred embodiments. The invention is not limited only to the above embodiments. It will be apparent to those skilled in the art that various modifications, improvements, combinations, and the like can be made.

What we claim are:

1. A method of forming a noble metal thin film comprising steps of:

(a) forming a metal sacrificial film on a substrate having an insulating surface and stacking a hard mask layer of different etching characteristics on the sacrificial film, the metal sacrificial film and the hard mask layer including no organic material;

(b) forming an opening having a predetermined pattern through said hard mask layer;

(c) etching said metal sacrificial film exposed in said opening and side-etching said sacrificial film over a boundary of the opening of said mask layer by a predetermined amount;

(d) depositing a noble metal thin film on a whole surface of said substrate to form a noble metal pattern on the insulating surface in the opening; and (e) dissolving and removing said sacrificial film to expose the insulating surface around the noble metal pattern.

2. A method according to claim 1, wherein said step (d) deposits noble metal particles along a direction tilted relative to a substrate normal.

3. A method according to claim 1, wherein a said step (b) forms a plurality of openings, and width of a mask layer between adjacent openings is 3 to 40 $\mu$m.

4. A method according to claim 1, wherein a thickness of said sacrificial film is 0.7 to 1 relative to a thickness of the noble metal thin film.

5. A method according to claim 1, wherein said substrate includes a lower substrate and a first insulating film formed on said lower substrate, and the method further comprises a step of (f) removing said lower substrate under said noble metal thin film.

6. A method according to claim 5 wherein said lower substrate is a silicon substrate and said first insulating film is a silicon oxide film.

7. A method according to claim 5, further comprising a step of (g) forming a second insulating film on said first insulating film, covering said noble metal thin film, before said step (f).

8. A method according to claim 7, wherein said second insulating film is a silicon oxide film.

9. A method according to claim 1, wherein said sacrificial film is made of a metal.

10. A method according to claim 9, wherein said metal is titanium.

11. A method according to claim 9, wherein said mask layer is made of an insulator.

12. A method according to claim 11, wherein said step (d) deposits noble metal particles along a direction tilted relative to a substrate normal.

13. A method according to claim 11, wherein a said step (b) forms a plurality of openings, and width of a mask layer between adjacent openings is 3 to 40 $\mu$m.

14. A method according to claim 11, wherein a thickness of said sacrificial film is 0.7 to 1 relative to a thickness of the noble metal thin film.

15. A method according to claim 11, wherein said substrate includes a lower substrate and a first insulating film formed on said lower substrate, and the method further comprises a step of (f) etching said lower substrate under said noble metal thin film.

16. A method according to claim 15 wherein said lower substrate is a silicon substrate and said first insulating film is a silicon oxide film.

17. A method according to claim 15, further comprising a step of (g) forming a second insulating film on said first insulating film, covering said noble metal thin film, before said step (f).

18. A method according to claim 17, wherein said second insulating film is a silicon oxide film.

19. A method according to claim 18, wherein said mask layer is made of silicon oxide or silicon nitride.

20. A method according to claim 19, wherein said noble metal is platinum.

* * * * *